United States Patent [19]
Davis

[11] 4,450,370
[45] May 22, 1984

[54] ACTIVE TERMINATION FOR A TRANSMISSION LINE

[75] Inventor: Thomas T. Davis, Bartlesville, Okla.

[73] Assignee: Phillips Petroleum Company, Bartlesville, Okla.

[21] Appl. No.: 8,149

[22] Filed: Jan. 31, 1979

[51] Int. Cl.³ .................. H03K 19/003; H03K 19/092
[52] U.S. Cl. ..................................... 307/475; 307/473
[58] Field of Search ......... 307/208, 209, 237, DIG. 1, 307/473, 475; 328/164; 333/22 R

[56] References Cited

U.S. PATENT DOCUMENTS

| | | | |
|---|---|---|---|
| 3,705,418 | 12/1972 | Yoshitake et al. | 307/237 |
| 3,832,575 | 8/1974 | Dasgupta et al. | 307/237 X |
| 3,937,988 | 2/1976 | De Clue et al. | 307/237 |
| 4,158,891 | 6/1979 | Fisher | 307/209 X |

OTHER PUBLICATIONS

McGraw-Hill Encyclopedia of Science and Technology, vol. 5, pp. 286-290 (1971).

J. B. Peatman "Microcomputer-Based Design," McGraw-Hill Book Company 1977, pp. 300-302.

*Primary Examiner*—John Zazworsky

[57] ABSTRACT

A tri-state buffer having the output thereof electrically connected to the input thereof is utilized to provide an active termination for a transmission line carrying data, addresses, commands or other information. The tri-state buffer is enabled by a strobe signal so as to insure that the transmission line will be stable through the time period of the strobe signal when data, commands, addresses or other information is being transferred.

A tri-state buffer having the output thereof electrically tied through a resistive element to the input thereof is utilized to provide an active termination for a transmission line carrying strobe-type signals. The tri-state buffer is always in an enabled state. The resistance element is used to help match the line impedance of the transmission line. This reduces the load on the strobe signal source and also reduces transmission line ringing due to impedance mismatches.

1 Claim, 4 Drawing Figures

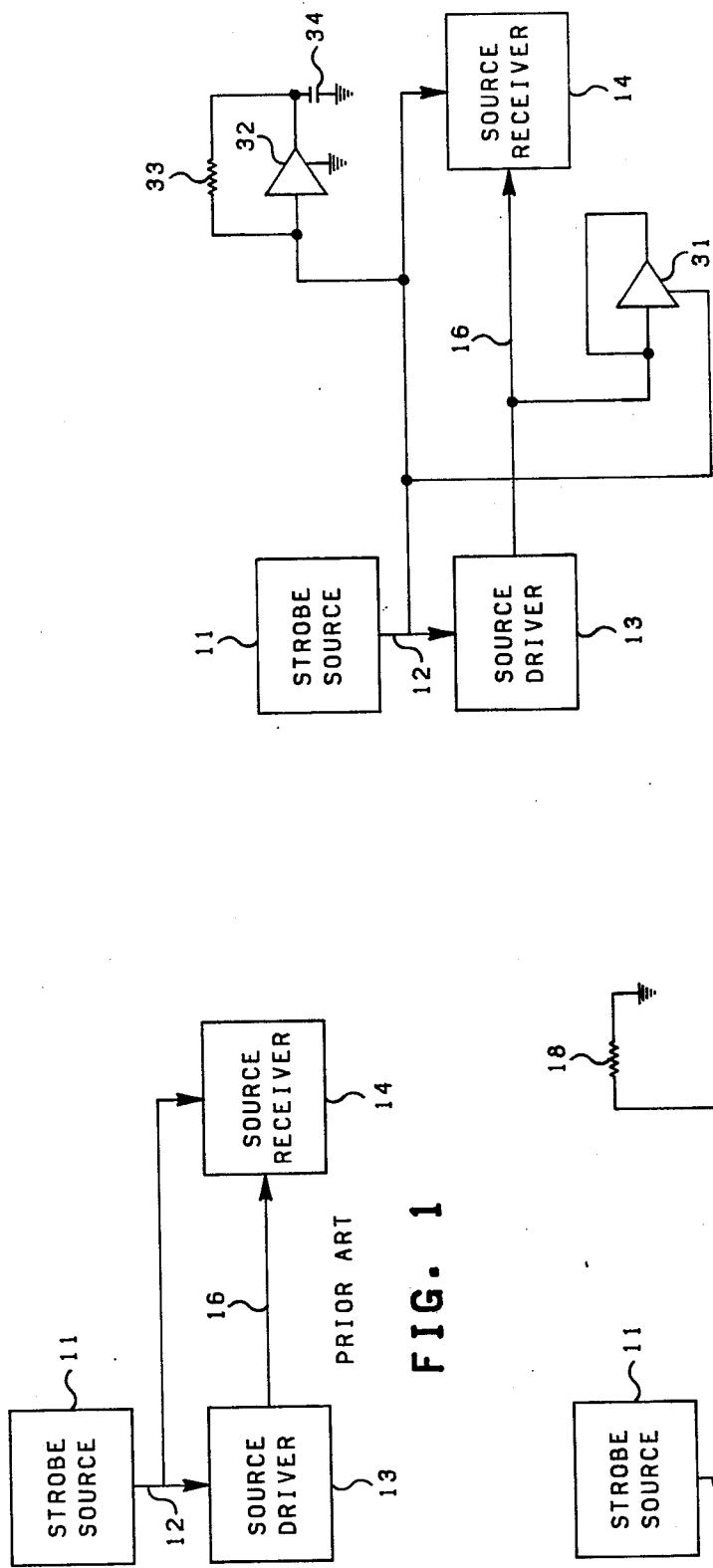

ACTIVE TERMINATION FOR A TRANSMISSION LINE

This invention relates to transmission lines. In a particular aspect this invention relates to method and apparatus for terminating a transmission line, carrying addresses, commands, data or other types of information, in an active termination. In another particular aspect this invention relates to method and apparatus for terminating a transmission line, carrying strobe-type signals, in an active termination.

A single wire may often be utilized to transmit electrical signals from a source to a receiver. A DC voltage applied to the source end of a long wire is transmitted to the load minus the voltage drop across the ohmic resistance of the conductor. This resistance is directly proportional to the length of the wire and inversely proportional to the cross sectional area. For good conductors this resistance is so small that it can usually be neglected for distances of hundreds of feet.

When alternating current is applied to the wire, the wire takes on the properties of an inductor which presents a series impedance to alternating current. Capacitance between the wire and a return wire or ground plane shunts part of the voltage to ground. Leakage losses of dielectric materials increase as the wave length of the alternating current or electrical signal decreases. A further complication is caused by skin effect which is the tendency of the alternating current in a wire to concentrate in the outer surface or "skin" of the conductor as the frequency of the electrical signal increases. Skin effect reduces the effective cross-sectional area of the conductor such that the effective resistance thereof increases. Thus, as the frequency increases into the megahertz range, the wire itself becomes a significant part of the total circuit. When this occurs, the wire begins to exhibit the characteristics of a transmission line and must be treated accordingly.

It is well known that a transmission line must be terminated properly. If the transmission line is not terminated with its characteristic impedance, the input impedance may become complex and exhibit inductive or capacitive characteristics depending on the nature of the load and its electrical distance from the source. If such a mismatch is encountered as the signal travels down the transmission line, a portion of the signal is reflected toward the source. The reflected wave combines with the forward wave and alters it according to its relative phase and amplitude. Another adverse result of such combination is a standing wave which varies in voltage at different points along the line.

FIG. 1 illustrates a standard data transfer system in which an impedance mismatch may be present. The strobe source 11 provides a clock signal 12 to both the source driver 13 and the source receiver 14. The source driver provides data, addresses, commands or other information to the source receiver through signal line 16. The information from the source driver 13 is commonly transferred to the source receiver during the time period in which the clock pulse 12 goes either high or low. If the input impedance of the source receiver is not matched to that of the line and to that of the source driver, then electrical signals being transferred from the source driver 13 to the source receiver 14 by means of transmission line 16 will be reflected in part by the impedance mismatch at the source receiver. Errors may thus occur in the transfer of information from the source driver to the receiver. It is also noted tht the clock signal 12 from the strobe source 11 may also be reflected from either the source driver 13 or the source receiver 14 if an impedance mismatch is present for the transmission line carrying the clock signal 12.

In the past it has been common to avoid impedance mismatches by the use of passive combinations for the transmission lines. As used herein the term "passive" refers to an electrical circuit which does not have a source of power which is capable of generating an electrical voltage in response to an electrical current input. Well known passive terminations for transmission lines which could be utilized for the transmission lines illustrated in FIG. 1 are illustrated in FIG. 2. Referring to FIG. 2, the strobe source 11 again supplies the clock signal 12 to the source driver 13 and to the source receiver 14. Information is transferred from the source driver 13 to the source receiver 14 by means of transmission line 16. The transmission line 16 is tied to the positive voltage supply 22 through the resistive element 21 and is further tied to ground through the resistive element 23. The transmission line carrying the clock signal 12 is tied to ground through resistor 18. The transmission line carrying the clock signal 12 would be tied to ground through resistor 18 where the information is transferred from the source driver 13 to the source receiver 14 when the clock signal 12 goes high. If the information were being transferred when the clock signal 12 goes low, then the transmission line carrying the clock signal 12 would be tied to a positive voltage supply through resistor 18 rather than to ground.

The resistor 18 is utilized to provide an impedance match for the transmission line carrying the clock signal 12. When the clock signal 12 goes high, current is supplied through the resistor 18 to ground and in this manner reflections are avoided if resistor 18 is chosen properly. In like manner, when the binary signal being transmitted over the transmission line 16 goes high, current will be supplied through the resistor 23 to ground which will reduce reflections on transmission line 16. When the binary data being transmitted on the transmission line 16 goes low, current is supplied from the positive voltage supply 22 through the resistor 21 to the source driver which is acting as a current sink. This holds the transmission line 16 low and thus avoids reflections on the transmission line 16.

Two problems are encountered when using the prior art termination method illustration in FIG. 2. Such passive termination method cannot match the transmission line impedances with complete accuracy because of the inductive and capacitive characteristics associated with the transmission lines. Thus, although the passive terminations do minimize reflections they do not completely eliminate reflections due to impedance mismatches. It is also noted that resistor 23 has the effect of loading the source driver 13 when the source driver is acting as a current source. Also the resistor 18 loads the strobe source 11 when the strobe source 11 is operating as a current source. This loading effect, which is characteristic of a passive termination, decreases the number of loads to which the strobe signal 12 can be supplied and also decreases the number of loads which can be tied to the transmission line 16.

It is thus an object of this invention to provide method and apparatus for terminating a transmission line, carrying addresses, commands, data or other types of information, in an active termination so as to avoid reflections caused by impedance mismatches and so as to also avoid loading of the transmission line by the termination. It is another particular object of this invention to provide method and apparatus for terminating a transmission line, carrying strobe-type signals, in an active termination so as to avoid reflections of the strobe-type signals and also to avoid loading the strobe source with the termination.

In accordance with the present invention, method and apparatus is provided by which a tri-state buffer having the output thereof electrically connected to the input is utilized to terminate a transmission line carrying addresses, commands, data or other types of information. The tri-state buffer, which is an active device is enabled by a strobe signal so as to insure that the transmission line will be stable through the time period of the strobe pulse in which data, commands, addresses or other information is being transferred from a source to a receiver. As used herein the term "active" refers to an electrical circuit which has a source of power capable of generating an electrical voltage in response to an electrical current input. This active termination insures that reflections will not occur on the transmission line and also insures that the termination will not load the source.

A tri-state buffer, having the output thereof electrically connected to the input through a resistive element, is utilized to terminate a transmission line carrying strobe-type signals. The resistive element is utilized to help match the impedance of the transmission line. This active termination reduces reflections due to impedance mismatches and also insures that the termination will not load the strobe source.

Other objects and advantages of the invention will be apparent from the description of the invention and the appended claims as well as from the detailed description of the drawings in which:

FIG. 1 is a prior art data transfer system;

FIG. 2 is a schematic representation of the prior art terminations for the transmission lines illustrated in FIG. 1;

FIG. 3 is a schematic illustration of applicant's termination for th transmission lines of FIG. 1.

Figure 4:
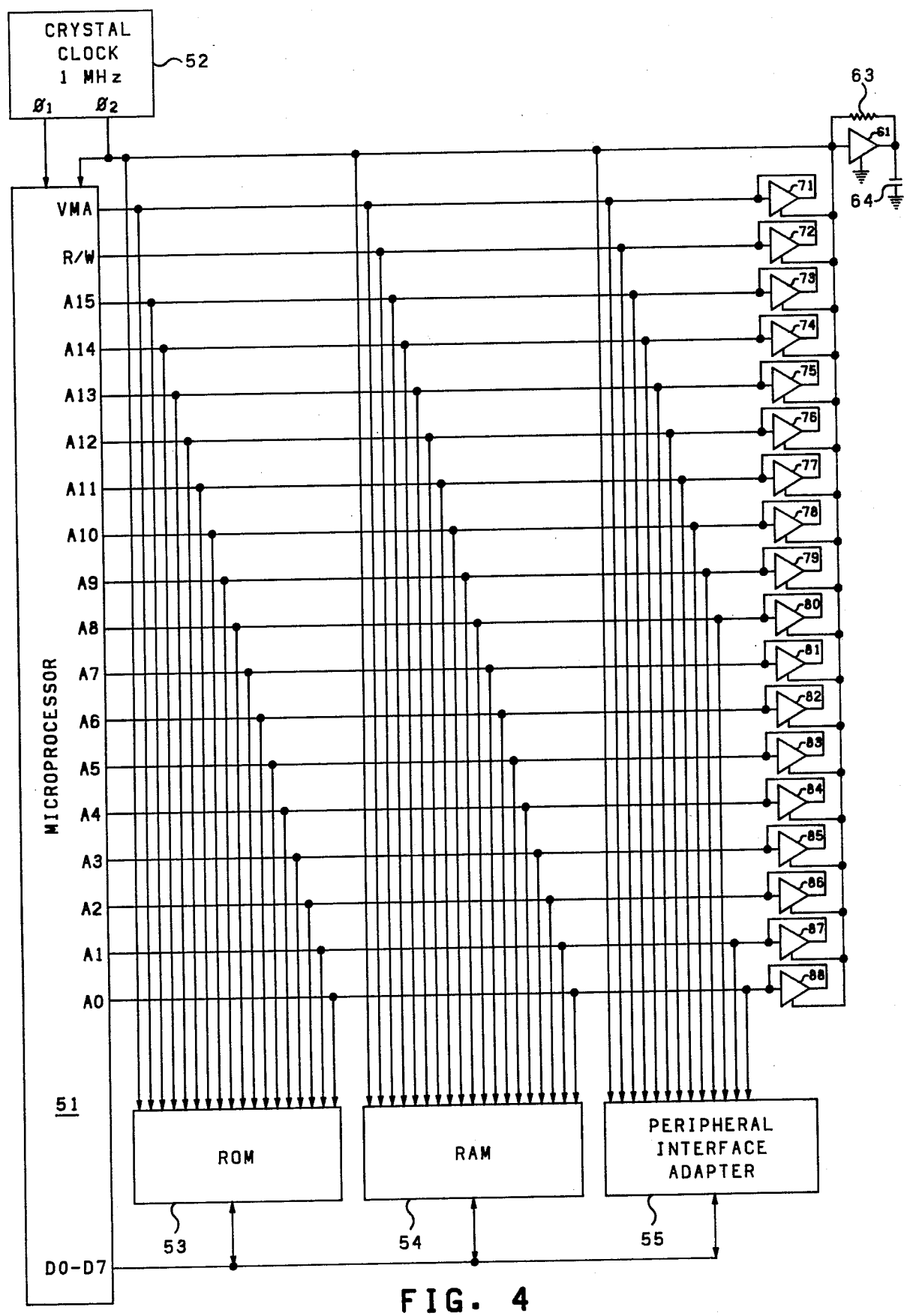
FIG. 4 is an illustration of a partial microprocessor system incorporating the present invention.

FIGS. 1 and 2 have been described in the foregoing description of the prior art and were utilized to illustrate the problems which the present invention was designed to solve. Referring now to FIG. 3, the strobe source 11 again supplies a clock signal 12 to both the source driver 13 and the source receiver 14. Data, commands, addresses or other information is transferred from the source driver 13 to the source receiver 14 by means of transmission line 16. The tri-state buffer 31 is utilized to terminate the transmission line 16. Transmission line 16 is electrically connected to the input of the tri-state buffer 31. The output of the tri-state buffer 31 is electrically connected to the input of the tri-state buffer 31. The clock signal 12 is electrically connected to the enabling input of the tri-state buffer 31. If a high level clock pulse 12 is being utilized, then the tri-state buffer 31 is of a type that is enabled by a high logic level. When the clock pulse 12 goes high, data, commands, addresses or other information is transferred from the source driver 13 to the source receiver 14 by means of the transmission line 16. The tri-state buffer 31 is enabled when the clock signal 12 goes high. If a high logic level is transmitted on the transmission line 16, the output of the tri-state buffer 31 goes high and the high logic level is held by the latching characteristic of the tri-state buffer 31 such that there is no reflection on the transmission line 16. The tri-state buffer 31 is an active device which generates a voltage in response to the high level logic signal being transmitted on the transmission line 16. Because the tri-state buffer 31 is an active device, the tri-state buffer 31 shares the loading requirements of the source driver 13 and thus enables the transmission line 16 to be supplied to a number of source receivers without overloading the source driver 13.

When a low logic level is being transmitted on the transmission line 16, the output of the tri-state buffer 31 goes low and the low logic level being transmitted on transmission line 16 is again held by the latching action of the tri-state buffer 31 so that there are no reflections.

When the clock signal 12 goes low, the tri-state buffer 31 is disabled and reverts to its high impedance state. Thus, the tri-state buffer 31 remains in a high impedance state unless the clock signal 12 goes high indicating that data, commands, addresses or other information is being transferred from the source driver 13 to the source receiver 14 by means of the transmission line 16.

The tri-state buffer 32 is utilized to provide an active termination for the transmission line carrying the strobe signal 12. The transmission line carrying the strobe signal 12 is electrically connected to the input of the tri-state buffer 32. The output of the tri-state buffer 32 is electrically connected to the input of the tri-state buffer 32 through resistor 33. The output of the tri-state buffer 32 is also electrically connected to ground through the capacitor 34. The enabling input of the tri-state buffer 32 is tied to ground. The tri-state buffer 32 is of a type that is enabled by a low input at the enabling input and thus, the tri-state buffer 32 is always enabled. The resistor 33 is utilized to help match the line impedance of the transmission line carrying the clock signal 12. The capacitor 34 is utilized to filter or absorb any high frequency glitches that may occur on the transmission line which carries the clock signal 12.

When the clock signal 12 goes high, the switching action of the tri-state buffer 32 presents the resistive load, which is represented by resistor 33, to the transmission line which is carrying the clock signal 12. The only power required of the strobe source is thus only the power required to drive the tri-state buffer 32 above its threshold point. Thus, the active termination does not appreciably load the strobe source and the number of loads to which the clock signal 12 can be supplied is greatly increased over prior art passive termination methods.

Referring now to FIG. 4, there is illustrated a microprocessor system incorporating the present invention. The microprocessor system is an MC-6800 Microprocessor System which is manufactured by Motorola Semiconductor. Other microprocessor systems could be utilized if desired and the invention is also applicable to any system in which it is desired to provide a termination for a transmission line. All of the signal lines and devices which are required in the 6800 Microprocessor System are not illustrated in FIG. 4 as they are not required to illustrate the present invention. A complete system diagram for the 6800 Microprocessor may be found in M6800 *Microcomputer System Design Data,* Motorola Semiconductor, 1976.

The microprocessor 51 corresponds to the source 13 illustrated in FIGS. 1, 2 and 3. As has been previously stated, the microprocessor 51 is the MC6800 MPU manufactured by Motorola Semiconductor. The crystal clock source 52 corresponds to the strobe source 11 which is illustrated in FIGS. 1, 2 and 3. The crystal clock 52 is preferably a one megahertz oscillator and driver, MC68718, manufactured by Motorola Semiconductor. The read-only memory 53, the random access memory 54 and the peripheral interface adapter 55 corresponds to the source receiver 14 in FIGS. 1, 2 and 3. The read-only memory 53 is preferably an MCM6830A manufactured by Motorola Semiconductor. The random access memory 54 is preferably an MCM6810A manufactured by Motorola Semiconductor. The peripheral interface adapter 55 is preferably an MC6820 PIA manufactured by Motorola Semiconductor.

The $\phi1$ clock signal from the crystal clock 52 is supplied as an input to the microprocessor 51. The $\phi2$ clock signal from the crystal clock 52 is supplied as an input to the microprocessor 51 and is also supplied as an input to the read-only memory 53, the random access memory 54 and the peripheral interface adapter 55. The $\phi2$ clock signal from the crystal clock signal 52 is also supplied as an input to the tri-state buffer 61 which provides an active termination for the $\phi2$ strobe line. The $\phi2$ clock signal from the crystal clock 52 is also supplied as an enabling input to the tri-state buffers 71–88.

The enabling input of the tri-state buffer 61 is tied to ground. The tri-state buffer 61 is preferably a 74LS367 manufactured by National Semiconductor. The 74LS367 tri-state buffer is enabled by a low input and thus the tri-state buffer 61 is always in an enabled state. The output of the tri-state buffer 61 is tied to the input of the tri-state buffer 61 through the resistor 63. The output of the tri-state buffer 61 is also tied to ground through the capacitor 64. The tri-state buffer 61 corresponds to the tri-state buffer 32, illustrated in FIG. 3, and operates in the same manner as has been previously described for the tri-state buffer 32, illustrated in FIG. 3, to provide an active termination for the $\phi2$ clock signal from the crystal clock 52.

The valid memory address signal (VMA) from the microprocessor 51 is supplied as an input to the read-only memory 53, the random access memory 54, and the peripheral interface adapter 55. The valid memory address is also supplied as an input to the tri-state buffer 71 which provides an active termination for the valid memory address line. The read/write signal (R/W) from the microprocessor 51 is supplied to the random access memory 54 and the peripheral interface adapter 55. The read/write signal is also supplied as an input to the tri-state buffer 72 which provides an active termination for the read/write line from the microprocessor 51. The A8–A15 address lines from the microprocessor 51 are provided as inputs to the read-only memory 53, the random access memory 54 and the peripheral interface adapter 55. The A8–A15 address lines are also provided as inputs to the tri-state buffers 80–73 respectively. The tri-state buffers 80–73 provide active terminations for the address lines A8–A15 respectively. The A7–A2 address lines are supplied as inputs to the read-only memory 53 and to the random access memory 54. The A7–A2 address lines are also supplied as input to the tri-state buffers 81–86 respectively. The tri-state buffers 81–86 provide active terminations for the address lines A7–A2 respectively. The A1–A0 address lines from the microprocessor 51 are provided as inputs to the read-only memory 53, the random access memory 54 and the peripheral interface adapter 55. The A1–A0 address lines are also supplied as inputs to the tri-state buffers 87–88 respectively. The tri-state buffers 87–88 provide active terminations for the address lines A1–A0. The D0–D7 data lines from the microprocessor 51 were supplied to the read-only memory 53, the random access memory 54 and the peripheral interface adapter 55. The D0–D7 data lines from the microprocessor 51 are not terminated in an active termination because such lines are bidirectional and, as such, are unpredictably sourced from all devices connected to such data bus.

The tri-state buffers 71–88 are preferably 74LS241 manufactured by Texas Instruments Inc. The 74LS241 tri-state buffer is enabled by a high input at the enabling input of the tri-state buffer. When the $\phi2$ clock signal from the crystal clock 52 goes high, addresses are transferred from the microprocessor 51 to the read-only memory 53, the random access memory 54 and the peripheral interface adapter 55. When the $\phi2$ clock signal goes high, the tri-state buffers 71–88 are enabled and the address lines A15–A0, the read/write line and the valid memory address line are all latched so as to prevent reflections. The tri-state buffers 71–88 correspond to the tri-state buffer 31, illustrated in FIG. 3, and operate in the same manner as previously described for the tri-state buffer 31, illustrated in FIG. 3, to provide an active termination for the A0–A15 address lines, the read/write line and the valid memory address line.

The invention has been described in terms of its presently preferred embodiment as is shown in FIGS. 3 and 4. The invention has been described in terms of specific components. However, many different types of tri-state buffers are commercially available and the invention is not limited to the specific tri-state buffers listed. The invention is also applicable to other types of active devices which function in the same manner as tri-state buffers. The resistor 63 illustrated in FIG. 4 is preferably 100 ohm resistor. However, other resistance values can be utilized depending upon the impedance of the $\phi2$ line. The capacitor 64 is preferably a 270 picofarad capacitor. However, other capacitance values could be utilized if desired.

While the invention has been described in terms of the presently preferred embodiment, reasonable variations and modifications are possible by those skilled in the art within the scope of the described invention and the appended claims.

That which is claimed is:

1. Apparatus comprising:
a source of electrical strobe signals;
a transmission line means for transmitting said electrical strobe signals;
an enabled tri-state buffer means;
a resistor;
means for electrically connecting the output of said enabled tri-state buffer means to the input of said enabled tri-state buffer means through said resistor;
means for electrically connecting said transmission line to the input of said enabled tri-state buffer means;
a capacitor; and
means for electrically connecting the output of said tri-state buffer means to ground through said capacitor.

* * * * *